(12) United States Patent
Yim et al.

(10) Patent No.: US 6,632,748 B2
(45) Date of Patent: Oct. 14, 2003

(54) COMPOSITION FOR PREPARING SUBSTANCES HAVING NANO-PORES

(75) Inventors: Jin Heong Yim, Daejun-Shi (KR); Yi Yeol Lyu, Daejun-Shi (KR); Sang Kook Mah, Seoul (KR); Eun Ju Nah, Daejun-Shi (KR); Il Sun Hwang, Daejun-Shi (KR); Keun Byoung Yoon, Daejun-Shi (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/961,449

(22) Filed: Sep. 25, 2001

(65) Prior Publication Data

US 2003/0055134 A1 Mar. 20, 2003

Related U.S. Application Data

(63) Continuation-in-part of application No. 09/918,432, filed on Aug. 1, 2001, now abandoned.

(30) Foreign Application Priority Data

Mar. 27, 2001 (KR) ........................................ 2001-15883

(51) Int. Cl.[7] .................... H01L 21/31; H01L 21/469

(52) U.S. Cl. .................... 438/780; 438/618; 438/778; 536/103

(58) Field of Search ................... 438/618, 780, 438/778, 800; 536/103; 526/279

(56) References Cited

U.S. PATENT DOCUMENTS

| | | | |
|---|---|---|---|
| 3,615,272 A | | 10/1971 | Collins et al. |
| 4,399,266 A | | 8/1983 | Matsumura et al. |
| 4,999,397 A | | 3/1991 | Weiss et al. |
| 5,268,442 A | * | 12/1993 | Bradshaw et al. ............ 528/25 |
| 5,965,679 A | | 10/1999 | Godschalx et al. |
| 6,093,636 A | | 7/2000 | Carter et al. |
| 6,107,357 A | | 8/2000 | Hawker et al. |
| 6,114,458 A | | 9/2000 | Hawker et al. |

* cited by examiner

*Primary Examiner*—Alexander Ghyka
(74) *Attorney, Agent, or Firm*—Birch, Stewart, Kolasch & Birch LLP

(57) ABSTRACT

The present invention provides a composition for preparing substances having nano-pores, said composition comprising cyclodextrin derivative, thermo-stable organic or inorganic matrix precursor, and solvent for dissolving said two solid components. There is also provided an interlayer insulating film having evenly distributed nano-pores with a diameter less than 50 Å, which is required for semiconductor devices.

16 Claims, 3 Drawing Sheets

COMPOSITION FOR PREPARING SUBSTANCES HAVING NANO-PORES

This application is a continuation-in-part of application Ser. No. 09/918,432 filed on Aug. 1, 2001, now abandoned the entire contents of which are hereby incorporated by reference.

FIELD OF THE INVENTION

The present invention relates to a composition for preparing substances having nano-pores. More specifically, the present invention relates to a composition comprising cyclodextrin derivatives as porogen, so as to form uniform nano-pores with a diameter less than 50 Å.

BACKGROUND OF THE INVENTION

Substances having nano-pores have been known to be useful for absorbents, carriers for catalysts, thermal insulators and electric insulators in various fields. In particular, they have been recently reported useful as materials for insulating films between interconnect layers in microelectronic devices. Feature size in the microelectronic device has to be reduced because circuit density in multilevel integrated circuit devices is increasing. But, there are problems such as R(resistance)×C(capacitance) delay due to crosstalk between interconnect lines. Therefore, dielectric constant of the interlayer insulating film should be lowered so as to decrease RC delay as much as possible. For this purpose, there have been attempts to use materials with low dielectric constant in the insulating film. For example, U.S. Pat. Nos. 3,615,272, 4,399,266 and 4,999,397 disclose polysilsesquioxanes with a dielectric constant of 2.5~3.1 which can be used in Spin On Deposition (SOD), as an alternative for $SiO_2$ with a dielectric constant of 4.0 which has been used in Chemical Vapor Deposition(CVD). In addition, U.S. Pat. No. 5,965,679 describes organic high molecules with a dielectric constant of 2.65~2.70, polyphenylenes. However, the dielectric constants of the previous matrix materials are not sufficiently low to achieve a very low dielectric constant less than 2.50 required for high-speed devices.

To solve this problem, there have been various trials to incorporate air bubbles into these organic and inorganic matrixes at a nano-scale. In this connection, U.S. Pat. No. 6,114,458 describes the use of lactone-based dendrimeric high molecules as porogen, which are degradable in the heating step to form a thin film. Further, U.S. Pat. Nos. 6,107,357 and 6,093,636 disclose a method for preparing low dielectric constant(k<3.0) substances comprising the steps of: mixing the lactone-based dendrimers or vinyl-based high molecular dendrimers such as polystyrene, polymethacrylate, polyester and the like along with the conventional organic or inorganic matrix; coating a thin film by using the mixture; and decomposing the porogens contained in the mixture at a high temperature to form nano-pores.

However, the porous substances produced by such methods have a problem that their pore sizes are as large as 50~100 Å in diameter and distribution thereof is inhomogeneous.

SUMMARY OF THE INVENTION

A feature of the present invention is a novel porogen for preparing substances wherein a number of nano-pores with a diameter less than 50 Å are uniformly distributed.

Another feature of the present invention is a composition for preparing substances wherein a number of nano-pores with a diameter less than 50 Å are uniformly distributed.

Still another feature of the present invention is a method for forming insulating film between interconnect layers in microelectronic devices, which have a dielectric constant $k \leq 2.5$, by using said composition.

In accordance with one aspect of the present invention, there is provided a composition for preparing substances having nano-pores, said composition comprising a cyclodextrin-based derivative, a thermo-stable organic or inorganic matrix precursor, and a solvent being capable of dissolving said two solid components.

In accordance with another aspect of the present invention, there is provided a method for forming interlayer insulating film between interconnect layers in microelectronic devices, said method comprising coating a substrate with said composition through spin-coating, dip-coating, spray-coating, flow-coating or screen printing; evaporating the solvent from said substrate; and heating said substrate at 150~600° C. under inert gas atmosphere or vacuum condition.

In accordance with still another aspect of the present invention, there is provided the substances having nano-pores produced by the use of said composition, and their use as heat resisting materials, electric insulators, absorbents, carriers for catalysts, and so on.

BRIEF DESCRIPTION OF THE DRAWINGS

The above and other features and advantages of the present invention will become more apparent after reading the following detailed description when taken in conjunction with the drawing in which.

DETAILED DESCRIPTION OF THE INVENTION

Figure 1:
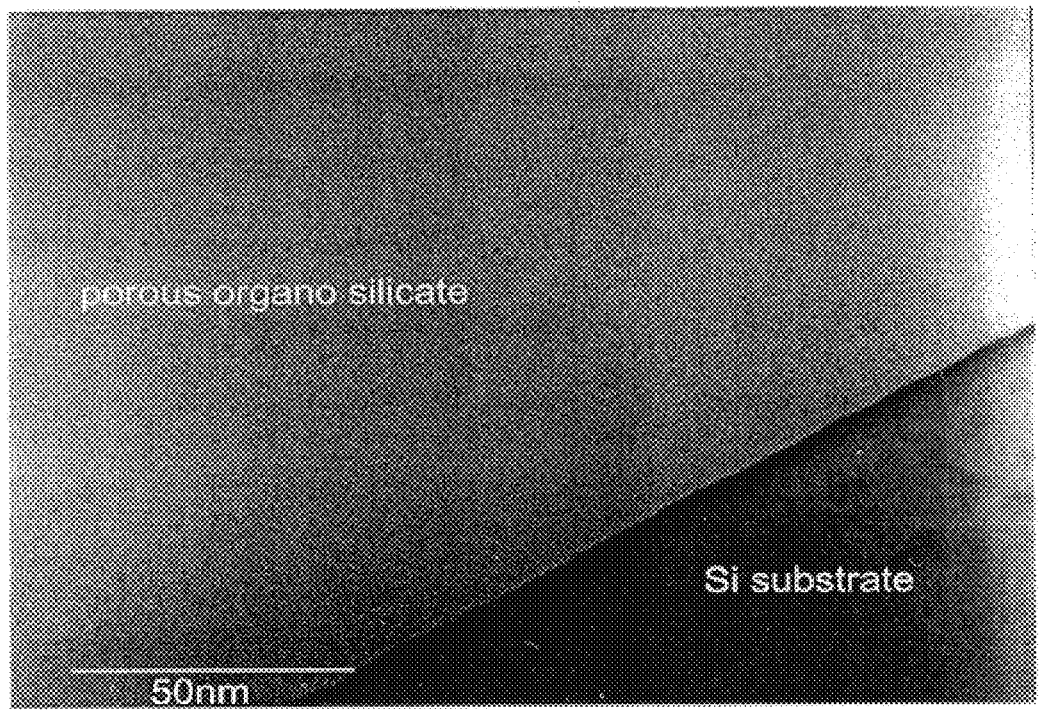
FIG. 1 is a sectional TEM image of the thin film according to Example 5–6.

The priority Korean Patent Application No. 2001-15883 filed on Mar. 27, 2001 is hereby incorporated in its entirety by reference.

According to the present invention, there is provided novel substances having evenly distributed nano-pores with a diameter less than 50 Å, wherein said substances are made from a composition comprising thermo-stable organic or inorganic matrix precursors and thermo-unstable cyclodextrin derivatives having limited 3D structure. These substances can be applied to a range of uses, including absorbent, carriers for catalysts, thermal insulators, electric insulators, and low dielectrics. In particular, these substances can be used to form thin films having very low dielectric constant($k \leq 2.50$) as insulating films between interconnect layers in microelectronic devices.

The thermo-stable matrix precursors used in the composition of the present invention may be organic or inorganic high molecules having a glass transition temperature higher than 400° C. Examples of the inorganic high molecule include, without limitation, (1) silsesquioxane, (2) silica sol with a number average molecular weight of 500~20,000 derived from partial condensation of tetraethoxysilane and so on, (3) a silicate composition wherein the constitution of $RSiO_{1.5}$ or $R_2SiO$ is organically modified(wherein, R is an organic substituent), and (4) partially condensed orthosilicate having the constitution of SiOR$_4$, all of which are composed of silicon, carbon, oxygen and hydrogen. The silsesquioxane derived from organic polysiloxane can be exemplified by hydrogen silsesquioxane, alkyl silsesquioxane, aryl silsesquioxane, and copolymer of these silsesquioxanes.

In addition, organic high molecules, which cure into stable reticular structure at a high temperature, are also preferred as the matrix precursor. Non-limiting examples of the organic high molecule include polyimide-based polymers which can undergo imidization, such as poly(amic acid), poly(amic acid ester), etc; polybenzocyclobutene-based polymers; and polyarylene-based polymers such as polyphenylene, poly(arylene ether), etc.

In the present invention, the matrix precursor is more preferably an organic polysiloxane-based resin comprising at least 10 mol %, preferably 25 mol % or more Si—OH, which is prepared through hydrolysis and polycondensation of siloxane monomers having cyclic or cage structure in the presence of an appropriate catalyst. In such polycondensation, siloxane monomers having either cyclic or cage structure as well as mixtures thereof can be used. Alternatively, the matrix precursor may be used in the present invention, which is prepared by addition of silane-based monomers into the siloxane monomers having either cyclic or cage structure, or mixture thereof, followed by polymerization.

The siloxane monomers having cyclic structure can be represented by the following formula (1):

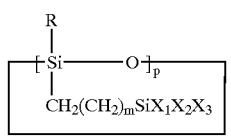

[1]

In the above formula (1),

R is hydrogen atom, $C_{1\sim3}$ alkyl group, $C_{3\sim10}$ cycloalkyl group, or $C_{6\sim15}$ aryl group;

$X_1$, $X_2$ and $X_3$ are independently $C_{1\sim3}$ alkyl group, $C_{1\sim10}$ alkoxy group, or halogen atom;

p is an integer ranging from 3 to 8; and m is an integer ranging from 1 to 10.

As can be seen from the above formula (1), silicon atoms are linked to each other through oxygen atoms to form cyclic structure, and the end of each branch comprises organic groups constituting a hydrolyzable substituent.

The method for preparing the cyclic siloxane monomers is not specifically limited, but hydrosililation reaction using a metal catalyst is preferred.

The siloxane monomers having cage structure can be represented by the following formulas (2) to (4):

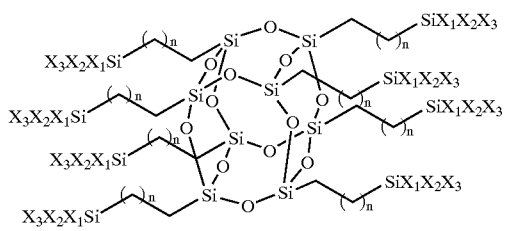

[2]

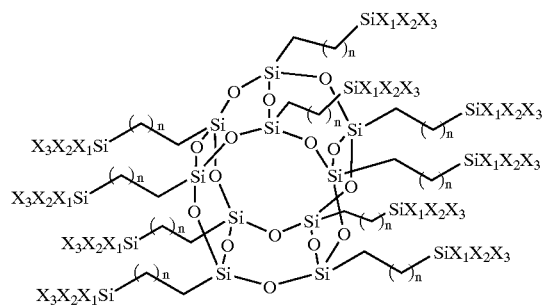

[3]

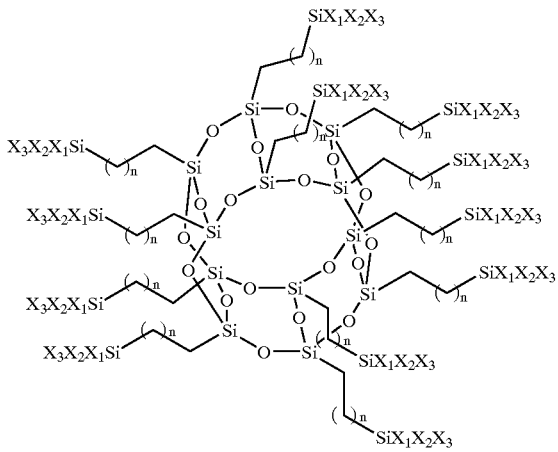

[4]

In the above formulas (2) to (4), $X_1$, $X_2$ and $X_3$ are independently $C_{1\sim3}$ alkyl group, $C_{1\sim10}$ alkoxy group, or halogen atom; and n is an integer ranging from 1 to 12.

As can be seen from the above formulas (2) to (4), silicon atoms in the same ring as well as the different rings are linked to each other through oxygen atoms to form cage structure, and the end of each branch comprises organic groups constituting a hydrolyzable substituent.

As the siloxane monomers having cage structure, commercially available siloxane monomers whose terminal functional groups are halogen atom can be used as it is or, if necessary, after converting the terminal halogen atoms into alkyl or alkoxy groups. Such conversion method is not specifically limited, as long as it does not inhibit the object of the present invention, and may be one of any previously known methods in the art. For example, conversion of terminal halogen atoms into alkoxy groups can be carried out by reacting the siloxane monomers with alcohol and triethylamine.

The silane-based monomers can be represented by the following formula (5):

$RSiX_1X_2X_3$ [5]

In the above formula (5),

R is hydrogen atom, $C_{1\sim3}$ alkyl group, $C_{3\sim10}$ cycloalkyl group, or $C_{6\sim15}$ aryl group; and $X_1$, $X_2$ and $X_3$ are independently $C_{1\sim3}$ alkyl group, $C_{1\sim10}$ alkoxy group, or halogen atom.

As can be seen from the above formula (5), the end of each branch comprises organic groups constituting a hydrolyzable substituent.

The catalyst used in the condensation reaction for preparing matrix monomers is not specifically limited, but preferably hydrochloric acid, benzenesulfonic acid, oxalic acid, formic acid, potassium hydroxide, sodium hydroxide, triethylamine, sodium bicarbonate, or pyridine.

In the hydrolysis and polycondensation reaction, water is added at 1.0~100.0 equivalents, preferably 1.0~10.0 equivalents per one equivalent of reactive groups in the monomers, and the catalyst is added at 0.00001~10 equivalents, preferably 0.0001~5 equivalents per one equivalent of reactive groups in the monomers, and then the reaction is carried out at 0~200° C., preferably 50~110° C. for 1~100 hrs, preferably 5~48 hrs. In addition, the organic solvent used in this reaction is preferably aromatic hydrocarbon solvent, aliphatic hydrocarbon solvent, ketone-based solvent, ether-based solvent, acetate-based solvent, alcohol-based solvent, silicon solvent, or mixtures thereof.

The thermo-unstable porogens used in the present invention are cyclodextrin derivatives represented by the following formula (6):

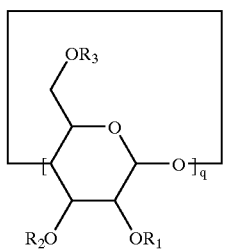

[6]

In the above formula (6), q is an integer ranging from 6 to 12;

$R_1$, $R_2$ and $R_3$ are independently hydrogen atom, halogen atom, $C_{2\sim30}$ acyl group, $C_{1\sim20}$ alkyl group, $C_{3\sim10}$ alkene group, $C_2$ alkyne group, $C_{7\sim20}$ tosyl group, $C_{1\sim10}$ mesyl group, $C_{0\sim10}$ amino group or azido group, $C_{0\sim10}$ phosphorous group, $C_{3\sim20}$ imidazole group or pyridino group, $C_{3\sim10}$ cycloalkyl group, $C_{6\sim30}$ aryl group, $C_{1\sim20}$ hydroxy alkyl group, carboxyl group, $C_{1\sim20}$ carboxy alkyl group, glucosyl group or maltosyl group, $C_{1\sim10}$ cyano group, $C_{2\sim10}$ carbonate group, $C_{1\sim10}$ carbamate group, or silicon compounds represented by $Sir_1r_2r_3$, wherein $r_1$, $r_2$ and $r_3$ are independently $C_{1\sim5}$ alkyl group, $C_{1\sim5}$ alkoxy group, or $C_{6\sim20}$ aryl group.

Examples of the porogen used in the present invention include α-, β- and γ-cyclodextrins represented by the following formulas (7) to (9), all of which have limited 3D structure with maximum radius of about 13~3 Å.

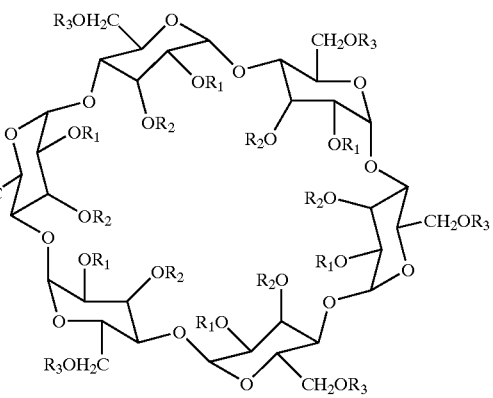

[7]

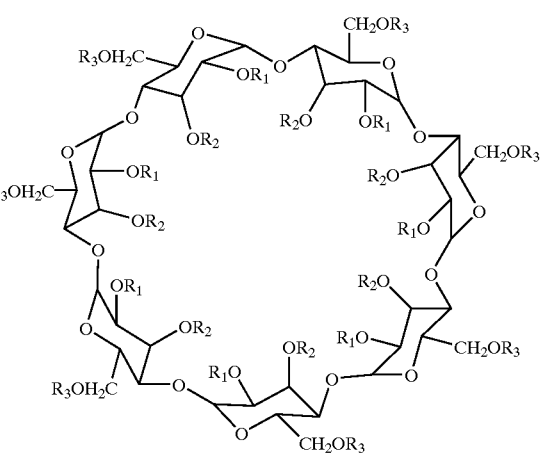

[8]

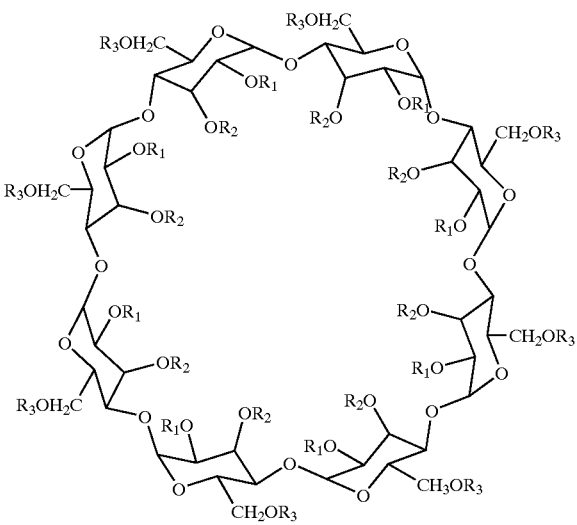

[9]

In the above formulas (7) to (9), $R_1$, $R_2$ and $R_3$ are independently hydrogen atom, $C_{2\sim30}$ acyl group, $C_{1\sim20}$ alkyl group, $C_{3\sim10}$ alkene group, $C_2$ alkyne group, $C_{7\sim20}$ tosyl group, $C_{1\sim10}$ mesyl group, $C_{0\sim10}$ amino group or azido group, $C_{0\sim10}$ phosphorous group, $C_{3\sim20}$ imidazole group or pyridino group, $C_{3\sim10}$ cycloalkyl group, $C_{6\sim30}$ aryl group, $C_{1\sim20}$ hydroxy alkyl group, carboxyl group, $C_{1\sim20}$ carboxy alkyl group, glucosyl group or maltosyl group, $C_{1\sim10}$ cyano group, $C_{2\sim10}$ carbonate group, $C_{1\sim10}$ carbamate group, or silicon compounds represented by $Sir_1r_2r_3$, wherein $r_1$, $r_2$ and $r_3$ are independently $C_{1\sim5}$ alkyl group, $C_{1\sim5}$ alkoxy group, or $C_{6\sim20}$ aryl group.

Specific examples of the porogen include, but not limited to, hexakis(2,3,6-tri-O-acetyl)-α-cyclodextrin, heptakis(2,3,6-tri-O-acetyl)-β-cyclodextrin, octakis(2,3,6-tri-O-acetyl)-γ-cyclodextrin, hexakis(2,3,6-tri-O-methyl)-α-cyclodextrin, heptakis(2,3,6-tri-O-methyl)-β-cyclodextrin, hexakis(6-O-tosyl)-α-cyclodextrin, hexakis(6-amino-6-O-deoxy)-α-cyclodextrin, heptakis(6-amino-6-O-deoxy)-β-cyclodextrin, bis(6-azido-6-deoxy)-β-cyclodextrin, hexakis(2,3-O-acetyl-6-bromo-6-deoxy)-α-cyclodextrin, heptakis(2,3-O-acetyl-6-bromo-6-deoxy)-β-cyclodextrin, mono(2-O-phosphoryl)-α-cyclodextrin, mono(2-O-phosphoryl)-β-cyclodextrin, hexakis(6-deoxy-6-(1-imdazolyl))-β-cyclodextrin, and mono(2,(3)-O-carboxymethyl)-α-cyclodextfin.

According to the present invention, coupling agents represented by the following formula (10) may be further used in order to increase compatibility of the matrix precursor with the cyclodextrin-based porogen to homogeneously disperse the porogen:

[10]

In the above formula (10), $F_1$ is alkoxy group, hydroxyl group, isocyanate group, ketene group, cyano group, amine group, anhydride group, imino ether group, or aldehyde group, which can react with $R_1$, $R_2$ and $R_3$ of the cyclodextrin-based porogen;

C is $C_{2\sim30}$ hydrocarbon chain; and $F_2$ is a reactive group to link to the reactive groups of the matrix, and thus varies according to the reactive groups of the matrix. For example, if polyphenylene matrix is used, $F_2$ may be acetylene group or cyclopentadinone group.

In the present invention, the composition for producing substances having nano-pores may be prepared by dissolving the above mentioned thermo-stable matrix precursors and the thermo-unstable cyclodextrin-based porogens in an appropriate solvent. Examples of this solvent include, but not limited to, aromatic hydrocarbons such as anisole, mesitylene and xylene; ketones such as methyl isobutyl ketone, 1-methyl-2-pyrrolidinone and acetone; ethers such as tetrahydrofuran and isopropyl ether; acetates such as ethyl acetate, butyl acetate and propylene glycol methyl ether acetate; amides such as dimethylacetamide and dimethylformamide; γ-butyolactone; alcohols such as isopropyl alcohol, butyl alcohol and octyl alcohol; silicon solvents; and mixtures thereof.

The solvent should be used in sufficient amount to coat a substrate fully with the two solid components(matrix precursor+cyclodextrin derivative), and may be present in the range of 20~99.9 wt. % in the composition(matrix precursor+cyclodextrin derivative+solvent). Further, content of the cyclodextrin derivative is preferably 0.1~95 wt. %, more preferably 10~70 wt. % of the solid components (matrix precursor+cyclodextrin derivative).

According to the present invention, the thin film having nano-pores formed on a substrate by the use of the composition of the present invention serves as a good interlayer insulating film required for microelectronic devices. The composition of the present invention is first coated onto a substrate through spin-coating, dip-coating, spray-coating, flow-coating, screen-printing and so on. More preferably, the coating step is carried out by spin-coating at 1000~5000 rpm. Following the coating, the solvent is evaporated from the substrate for a resinous film to deposit on the substrate. At this time, the evaporation may be carried out by simple air-drying, or by subjecting the substrate, at the beginning of curing step, to vacuum condition or mild heating($\leq 100°$ C.). The resulting resinous coating film may be cured by heating at a temperature of 150~600° C., more preferably 200~450° C. wherein pyrolysis of the cyclodextrin-based porogen occurs, so as to provide insoluble film without crack. As used herein, by "film without crack" is meant a film without any crack observed with an optical microscope at a magnification of 1000×. As used herein, by "insoluble film" is meant a film which is substantially insoluble in any solvent described as being useful for the coating and deposition of the siloxane-based resin. The heat-curing of the coating film may be performed under inert gas (nitrogen, argon, etc.) atmosphere or vacuum condition for even 10 hrs, preferably 30 min to 2 hrs.

Following the curing, fine pores with a diameter less than 50 Å may be formed in the matrix. Alternatively, more fine pores with a diameter less than 30 Å may be homogeneously formed, for example, through chemical modification of the cyclodextrin-based porogen.

The thin film obtained from the above has a low dielectric constant($k \leq 2.5$). Further, in the case that 30 weight parts of the cyclodextrin-based porogen are mixed with 70 weight parts of the matrix precursor(i.e., content of the cyclodextrin derivative is 30 wt. % of the solid mixture), very low dielectric constant($k \leq 2.2$) may be also achieved.

The present invention can be more clearly understood with referring to the following examples. It should be understood that the following examples are not intended to restrict the scope of the present invention in any manner.

EXAMPLE 1

Synthesis of Matrix Monomers

EXAMPLE 1-1

Synthesis of Matrix Monomer A

To a flask were added 29.014 mmol (10.0 g) 2,4,6,8-tetramethyl-2,4,6,8-tetravinylcyclotetrasiloxane and 0.164 g platinum(O)-1,3-divinyl-1,1,3,3-tetramethyldisiloxane complex (solution in xylene), and then diluted with 300 ml diethylether. Next, the flask was cooled to −78° C., 127.66 mmol (17.29 g) trichlorosilane was slowly added thereto, and then it was slowly warmed to room temperature. The reaction was continued at room temperature for 20 hrs, and any volatile materials were removed from the reaction mixture under reduced pressure of about 0.1 torr. To the mixture was added 100 ml pentane and stirred for 1 hr, and then the mixture was filtered through celite to provide a clear colorless solution. The pentane was evaporated from the solution under reduced pressure of about 0.1 torr to afford a colorless liquid compound, [—Si(CH₃)(CH₂CH₂Cl₃)O—]₄ in a yield of 95%.

11.28 mmol (10.0 g) of the compound was diluted with 500 ml tetrahydrofuran, and 136.71 mmol (13.83 g) triethylamine was added thereto. Thereafter, the mixture was cooled to −78° C., 136.71 mmol (4.38 g) methyl alcohol was slowly added thereto, and it was slowly warmed again to room temperature. The reaction was continued at room temperature for 15 hrs, filtered through celite, and then volatile materials were evaporated from the filtrate under reduced pressure of about 0.1 torr. Subsequently, 100 ml pentane was added thereto and stirred for 1 hr, and then the mixture was filtered through celite to provide a clear colorless solution. The pentane was evaporated from this solution under reduced pressure of about 0.1 torr to afford monomer A represented by the following formula (11) as a colorless liquid in a yield of 94%:

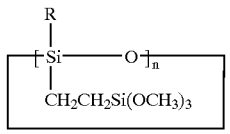

[11]

EXAMPLE 1-2

Synthesis of Matrix Monomer B

To a flask was added 7.194 mmol (10.0 g) octa(chlorosilylethyl)-POSS, and then diluted with 500 ml tetrahydrofuran, followed by addition of 63.310 mmol (6.41 g) triethylamine. Next, the flask was cooled to −78° C., 63.310 mmol (2.03 g) methylalcohol was slowly added thereto, and then it was slowly warmed to room temperature. The reaction was continued at room temperature for 20 hrs, filtered through celite, and then any volatile materials were removed from the filtrate under reduced pressure of about 0.1 torr. To the filtrate was added 100 ml pentane and stirred for 1 hr, and then the mixture was filtered through celite to provide a clear colorless solution. The pentane was evaporated from this solution under reduced pressure of about 0.1 torr to afford monomer B represented by the following formula (12) as a colorless liquid in a yield of 90%.

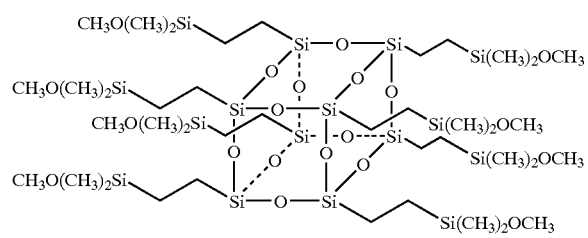

[12]

EXAMPLE 2

Synthesis of Matrix Precursors

EXAMPLE 2-1

Precursor A: Homopolymerization of Monomer A

To a flask was added 9.85 mmol (8.218 g) monomer A, and then diluted with 90 ml tetrahydrofuiran. Next, dil. HCl solution (1.18 mmol hydrochloride) prepared by dilution of 8.8 ml conc. HCl (35 wt. % hydrochloride) with 100 ml D.I.-water was slowly added thereto at −78° C., followed by addition of more D.I.-water, so that total amount of water including the inherent water in the above added dil. HCl solution may be 393.61 mmol (7.084 g). Thereafter, the flask was slowly warmed to 70° C., and allowed to react for 16 hrs. Then, the reaction mixture was transferred to a separatory funnel, 90 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 5.3 g of precursor A as white powder.

EXAMPLE 2-2

Precursor B: Copolymerization of Monomer A and Methyltrimethoxysilane

To a flask were added 37.86 mmol (5.158 g) methyltrimethoxysilane and 3.79 mmol (3.162 g) monomer A, and then diluted with 100 ml tetrahydrofuran. Next, dil. HCl solution (0.0159 mmol hydrochloride) prepared by dilution of 0.12 ml conc. HCl (35 wt. % hydrochloride) with 100 ml D.I.-water was slowly added thereto at −78° C., followed by addition of more D.I.-water, so that total amount of water including the inherent water in the above added dil. HCl solution may be 529.67 mmol (9.534 g). Thereafter, the flask was slowly warmed to 70° C., and allowed to react for 16 hrs. Then, the reaction mixture was transferred to a separatory funnel, 100 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 5.5 g of precursor B as white powder.

EXAMPLE 2-3

Precursor C: Copolymerization of Monomer A and Monomer B

To a flask were added 13.28 mmol (11.08 g) monomer A and 2.39 mmol (2.00 g) monomer B, and then diluted with 100 ml tetrahydrofuran. Next, dil. HCl solution (0.0159 mmol hydrochloride) prepared by dilution of 0.12 ml conc. HCl (35 wt. % hydrochloride) with 100 ml D.I.-water was slowly added thereto at −78° C., followed by addition of more D.I.-water, so that total amount of water including the inherent water in the above added dil. HCl solution may be 529.67 mmol (9.534 g). Thereafter, the flask was warmed to 70° C., and allowed to react for 16 hrs. Then, the reaction mixture was transferred to a separatory funnel, 100 ml diethylether was added thereto, and then rinsed with 5×100 ml D.I.-water. Subsequently, 5 g anhydrous sodium sulfate was added thereto and stirred at room temperature for 10 hrs to remove a trace of water, and then filtered out to provide a clear colorless solution. Any volatile materials were evaporated from this solution under reduced pressure of about 0.1 torr to afford 6.15 g of precursor C as white powder.

EXAMPLE 3

Fractionation

EXAMPLE 3-1

Fractionation of Precursor A

To a flask was added 5 g precursor A obtained from the above Example 2-1, and then dissolved with 7 ml acetone. The resulting solution was filtered through a syringe filter having 0.2 $\mu$M pores to remove fine particles and other contaminants therefrom. Then, the clear filtrate was recovered and 20 ml water was slowly added thereto. The resulting white powder was separated from the remaining liquid (mixture of acetone and water), and then dried at 0~5° C. under reduced pressure of about 0.1 torr to afford 3.7 g of fractionated polymer.

EXAMPLE 3-2

Fractionation of Precursor B

The procedure of Example 3-2 was conducted according to the same manner as in the above Example 3-1, except that precursor B obtained from the above Example 2-2 was used instead of precursor A. As a result, 3.5 g of fractionated polymer were obtained.

EXAMPLE 3-3

Fractionation of Precursor C

The procedure of Example 3-3 was conducted according to the same manner as in the above Example 3-1, except that precursor C obtained from the above Example 2-3 was used instead of precursor A. As a result, 4.1 g of fractionated polymer were obtained.

EXAMPLE 4

Analysis of the Matrix Precursors

The siloxane-based resinous precursors thus prepared were analyzed for molecular weight(hereinafter, referred to as "MW") and molecular weight distribution(hereinafter, referred to as "MWD") by means of gel permeation chromatography(Waters Co.), and the Si—OH, Si—OCH$_3$ and Si—CH$_3$ contents (%) of their terminal groups were analyzed by means of NMR (Bruker Co.). The results are set forth in the following Table 1.

TABLE 1

| Precursor | MW | MWD | Si—OH (%) | Si—OCH$_3$ (%) | Si—CH$_3$ (%) |
|---|---|---|---|---|---|
| Precursor (A) | 60800 | 6.14 | 35.0 | 1.2 | 63.8 |
| Precursor (B) | 4020 | 2.77 | 39.8 | 0.5 | 59.7 |
| Precursor (C) | 63418 | 6.13 | 26.3 | 0.7 | 73.0 |

Si—OH(%) = Area(Si—OH) ÷ [Area(Si—OH) + Area(Si—OCH$_3$) + Area(Si—CH$_3$)] × 100
Si—OCH$_3$(%) = Area(Si—OCH$_3$) ÷ [Area(Si—OH) + Area(Si—OCH$_3$) + Area(Si—CH$_3$)] × 100
Si—CH$_3$(%) = Area(Si—CH$_3$) ÷ [Area(Si—OH) + Area(Si—OCH$_3$) + Area(Si—CH$_3$)] × 100

EXAMPLE 5

Determination of Thickness and Refractive Index of the Thin Film made from the Substance having Nano-pores The resinous compositions of the present invention were prepared by mixing the siloxane-based resinous matrix precursor obtained from the above Example 3 together with heptakis(2,4,6-tri-O-methyl)-β-cyclodextrin and methyl isobutyl ketone in accordance with the particular ratios as described in the following Table 2. These compositions were applied to spin-coating at 3000 rpm onto p-type silicon wafers doped with boron. The substrates thus coated were then subjected to a series of soft baking on a hot plate for 1 min at 150° C. and another minute at 250° C., so that the organic solvent might be sufficiently removed. Then, the substrates were cured in a Linberg furnace at 420° C. for 60 min under vacuum condition. Thereafter, the thickness of each resulting low dielectric film was determined by using prism coupler, ellipsometer and profiler, and the refractive index determined by using prism coupler and ellipsometer. The results are set forth in the following Table 2. In the Table 2, the abbreviations "T" and "R.I." represent thickness and refractive index of the film, respectively.

TABLE 2

| | | | | Prism Coupler | | Ellipsometer | | Profiler |
|---|---|---|---|---|---|---|---|---|
| Example No. | Precursor | Mat.[1] (wt. %) | CD[2] (wt. %) | T ( ) | R.I | T ( ) | R.I. | T ( ) |
| Example 5-1 | Precursor (A) | 12.0 | 0.0 | 5909 | 1.435 | 6146 | 1.438 | 5930 |
| Example 5-2 | Precursor (A) | 12.0 | 10.0 | 6088 | 1.407 | 6788 | 1.405 | 6393 |
| Example 5-3 | Precursor (A) | 12.0 | 20.0 | 6843 | 1.374 | 7212 | 1.379 | 6809 |
| Example 5-4 | Precursor (A) | 12.0 | 30.0 | 6741 | 1.356 | 7381 | 1.363 | 6947 |
| Example 5-5 | Precursor (A) | 12.0 | 40.0 | 7032 | 1.342 | 7869 | 1.340 | 7475 |
| Example 5-6 | Precursor (A) | 14.3 | 16.7 | — | — | 8529 | 1.361 | 7777 |
| Example 5-7 | Precursor (A) | 12.5 | 28.5 | — | — | 6644 | 1.359 | 6053 |
| Example 5-8 | Precursor (B) | 17.0 | 0.0 | 7339 | 1.416 | 7469 | 1.415 | 7057 |
| Example 5-9 | Precursor (B) | 17.0 | 10.0 | 7871 | 1.380 | 7996 | 1.379 | 7456 |
| Example 5-10 | Precursor (B) | 17.0 | 20.0 | 8822 | 1.363 | 9024 | 1.357 | 8423 |
| Example 5-11 | Precursor (B) | 17.0 | 30.0 | 9306 | 1.349 | 9681 | 1.335 | 8921 |
| Example 5-12 | Precursor (B) | 17.0 | 40.0 | 10025 | 1.336 | 10315 | 1.332 | 9575 |
| Example 5-13 | Precursor (B) | 15.8 | 0.0 | — | — | 5467 | 1.411 | 4933 |
| Example 5-14 | Precursor (B) | 14.3 | 16.7 | — | — | 5699 | 1.358 | 5172 |
| Example 5-15 | Precursor (B) | 12.5 | 28.5 | — | — | 4945 | 1.335 | 4392 |
| Example 5-16 | Precursor (C) | 15 | 0.0 | 8168 | 1.433 | — | — | 7751 |
| Example 5-17 | Precursor (C) | 15 | 10 | 9102 | 1.396 | — | — | 8565 |
| Example 5-18 | Precursor (C) | 15 | 20 | 9434 | 1.376 | — | — | 8891 |
| Example 5-19 | Precursor (C) | 15 | 30 | 9975 | 1.358 | — | — | 8982 |

Mat.[1] (wt. %) = weight of matrix precursor(g)/[weight of MIBK(g) + weight of precursor(g)] × 100

TABLE 2-continued

| | | Mat.[1] | CD[2] | Prism Coupler | | Ellipsometer | | Profiler |
| | | | | T | | T | | T |
| Example No. | Precursor | (wt. %) | (wt. %) | ( ) | R.I | ( ) | R.I. | ( ) |
|---|---|---|---|---|---|---|---|---|

CD[2] (wt. %) = weight of HTM-β-cyclodextrin(g)/[weight of HTM-β-cyclodextrin(g) + weight of matrix precursor(g)] × 100
MIBK: methyl isobutyl ketone
HTM-β-cyclodextrin: heptakis (2,4,6-tri-O-methyl)-β-cyclodextrin

EXAMPLE 6

Determination of Dielectric Constant of the Thin Film

Each of the thin films formed in the above Example 5 was evaluated for dielectric constant, by using Hg CV meter (SSM 490i CV system, Solid State Measurements), at a frequency of approximately 1 MHz in the gate voltage range of −220V through 220V. To find dielectric constant, capacitance of a reference piece coated with thermal silicon oxide, whose film thickness and dielectric constant have been previously determined, was first measured, and contact area between Hg electrode and the reference piece was calculated from the following equation and set down as a reference value:

$$A = C \times t / k$$

In the above equation, "A" is the contact area between Hg electrode and the reference piece, "C" is the measured capacitance, "t" is the thickness of the thermal silicon oxide film, and "k" is the dielectric constant of the reference substance (3.9 for thermal silicon oxide used herein).

In the C-V measurement, resinous film thickness of a test piece(herein after, referred to as "conversion thickness"), which corresponds to the reference dielectric constant k=3.9, is determined based on capacitance of the test piece and the reference value above, and thereafter, the conversion thickness and the film thickness of the test piece previously determined in the above Example 5 are substituted into the following equation, to provide the dielectric constant "k" of the test piece:

$$k_{test\ piece} = 3.9 \times t_{test\ piece} / \text{conversion thickness}$$

The dielectric constants thus determined are set forth in the following Table 3.

TABLE 3

| Example | Precursor | Mat.[1] (wt. %) | CD[2] (wt. %) | Thickness[3] ( ) | Dielectric constant (k) |
|---|---|---|---|---|---|
| Example 5-1 | Precursor (A) | 12.0 | 0.0 | 5909 | 2.25 |
| Example 5-2 | Precursor (A) | 12.0 | 10.0 | 6088 | 2.14 |
| Example 5-3 | Precursor (A) | 12.0 | 20.0 | 6843 | 2.10 |
| Example 5-4 | Precursor (A) | 12.0 | 30.0 | 6741 | 2.09 |
| Example 5-5 | Precursor (A) | 12.0 | 40.0 | 7032 | 2.02 |
| Example 5-8 | Precursor (B) | 17.0 | 0.0 | 7339 | 2.45 |
| Example 5-9 | Precursor (B) | 17.0 | 10.0 | 7871 | 2.26 |
| Example 5-10 | Precursor (B) | 17.0 | 20.0 | 8822 | 2.23 |
| Example 5-11 | Precursor (B) | 17.0 | 30.0 | 9306 | 2.12 |
| Example 5-12 | Precursor (B) | 17.0 | 40.0 | 10025 | 2.05 |
| Example 5-16 | Precursor (C) | 15 | 0 | 8168 | 2.38 |
| Example 5-17 | Precursor (C) | 15 | 10 | 9102 | 2.25 |

Mat.[1] (wt. %) = weight of matrix precursor(g)/[weight of MIBK(g) + weight of precursor(g)] × 100
CD[2] (wt. %) = weight of HTM-β-cyclodextrin(g)/[weight of HTM-β-cyclodextrin(g) + weight of matrix precursor(g)] × 100
Thickness[3]: measured by using a prism coupler in the above Example 5
MIBK: methyl isobutyl ketone
HTM-β-cyclodextrin = heptakis(2,4,6-tri-o-methyl)-β-cyclodextrin

EXAMPLE 7

Observation of Sectional TEM Image of the Thin Film

Figure 2:
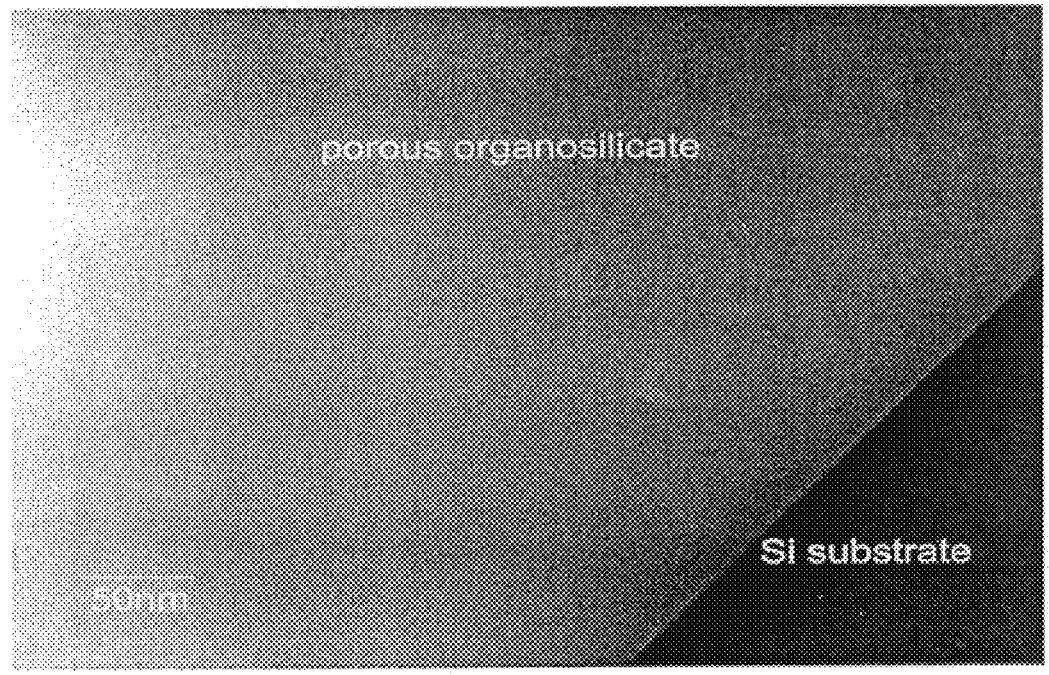
FIG. 2 is a sectional TEM image of the thin film according to Example 5–7.
Figure 3:
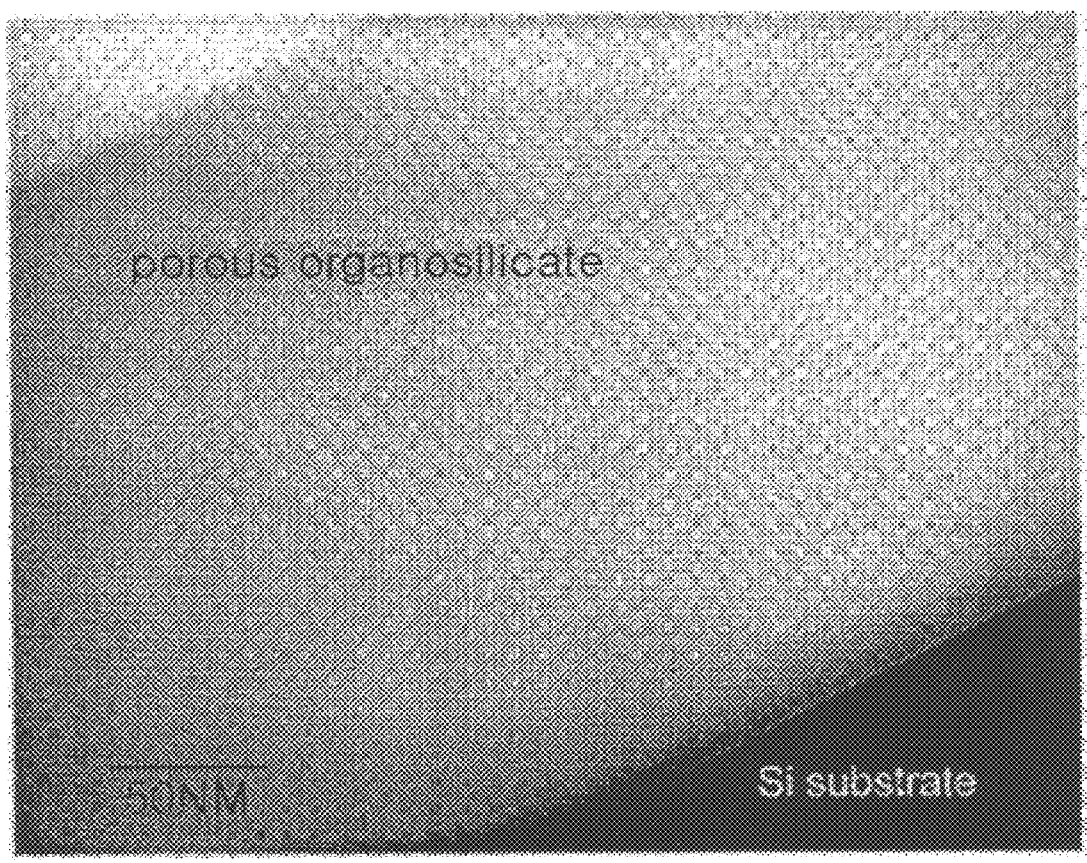
FIG. 3 is a sectional TEM image of the thin film according to Example 5–13.
Figure 4:
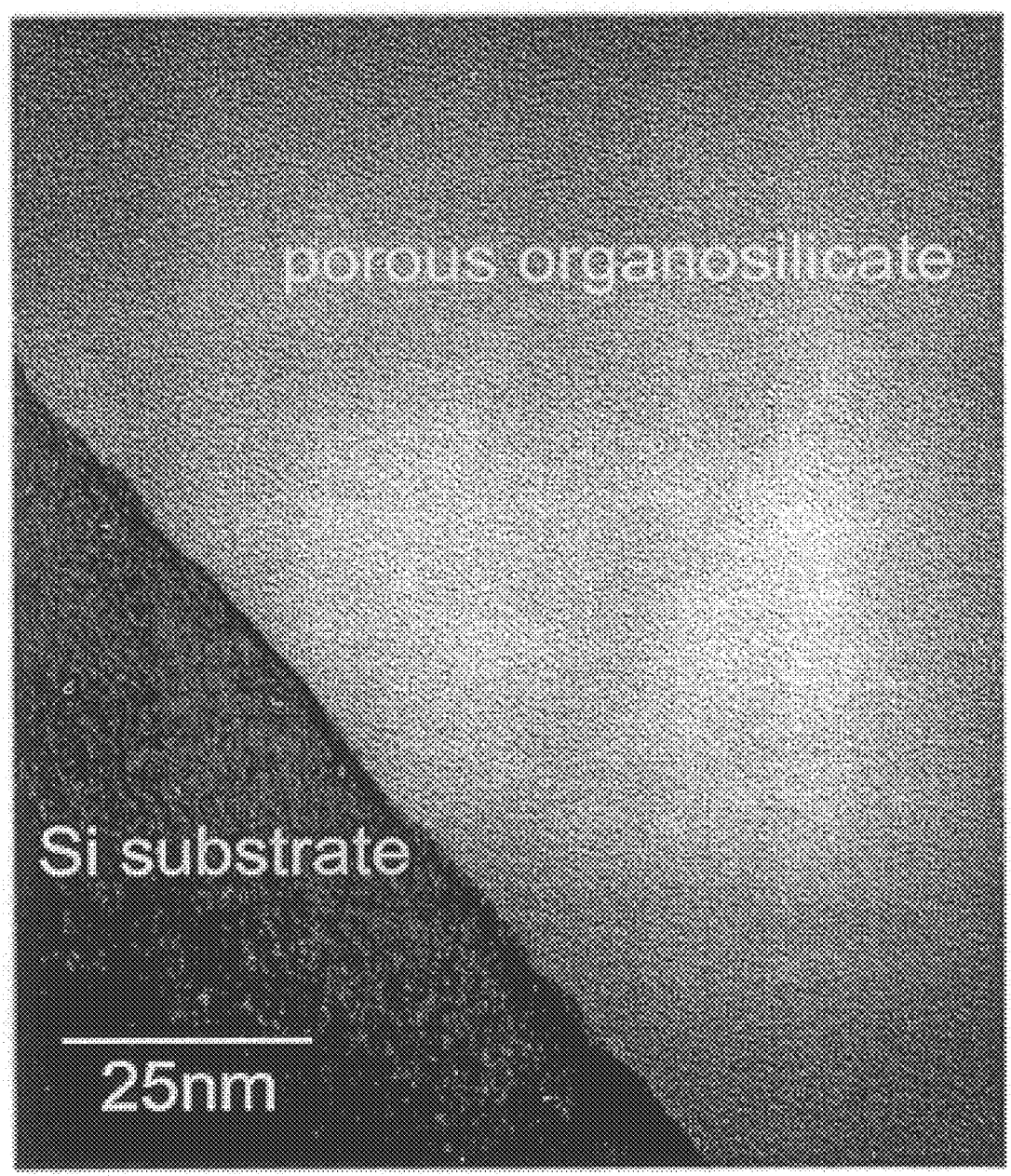
FIG. 4 is a sectional TEM image of the thin film according to Example 5–15.

To observe nano-pores in the thin film, each of the silicon wafers coated as described in the above Example 5 was subjected to sectional image analysis using TEM H9000NA operating at 300 kV. The results are shown in the photographic FIGS. 1 to 4.

Nano-pores having diameters more than 50 Å were not found on the films as shown in FIGS. 1~4, so the produced thin films have uniform surface.

EXAMPLE 8

BET $N_2$ Absorption Analysis

Physical properties of the nano-pores in the thin film were analyzed according to BET $N_2$ absorption method. The results are shown in the Table 4.

TABLE 4

| Low-k film | Average pore size(Å) | Pore volume(cc/g) | Surface area(m²/g) |
|---|---|---|---|
| Example 5-3 | 16.9 | 0.180 | 483 |
| Example 5-4 | 17.0 | 0.220 | 522 |
| Example 5-5 | 19.6 | 0.370 | 593 |

According to the present invention, substances having plurality of nano-pores with a diameter less than 50 Å can be easily prepared by using the resinous composition of the present invention. Such substances may be used as heat-resistant materials, electric insulators, absorbents, carriers for catalysts and so on. In particular, these substances may be useful for insulating films between interconnect layers in microelectronic devices, since their dielectric constant, k is as sufficiently low as 2.5 or less.

The simple modification and change of the present invention will be readily made by any person having an ordinary knowledge in the relevant art and it should understood that all of such modification and change are encompassed within the scope of the present invention.

What is claimed is:

1. A composition for preparing substances having nanopores, said composition comprising:
   cyclodextrin derivative;
   thermo-stable organic or inorganic matrix precursor; and
   solvent for dissolving both the cyclodextrin derivative and the matrix precursor
   wherein the matrix precursor is siloxane-based resin which is prepared by hydrolysis and polycondensation of one or more monomers selected from the group consisting of compounds represented by the following formulas (1) to (5) in an organic solvent in the presence of a catalyst and water:

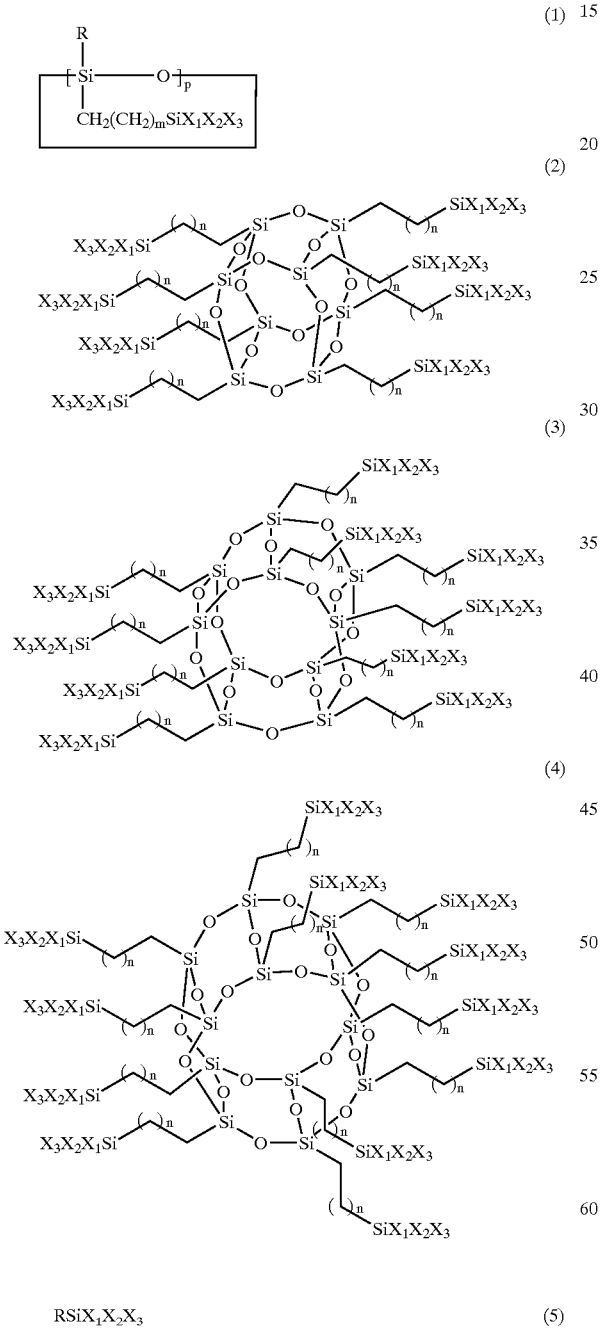

RSiX$_1$X$_2$X$_3$ (5)

in which, R is hydrogen atom, C$_{1\sim3}$ alkyl group, C$_{3\sim10}$ cycloalkyl group, or C$_{6\sim15}$ aryl group; X$_1$, X$_2$ and X$_3$ are independently C$_{1\sim3}$ alkyl group, C$_{1\sim10}$ alkoxy group, or halogen atom; p is an integer ranging from 3 to 8; m is an integer ranging from 1 to 10; and n is an integer ranging from 1 to 12.

2. The composition according to claim 1, wherein content of the cyclodextrin derivative is 0.1~95 wt. % of the solid components(the cyclodextrin derivative+the matrix precursor).

3. The composition according to claim 1, wherein content of the solvent is 20.0~99.9 wt. % of the composition.

4. The composition according to claim 1, wherein the cyclodextrin derivative is represented by the following formula (6):

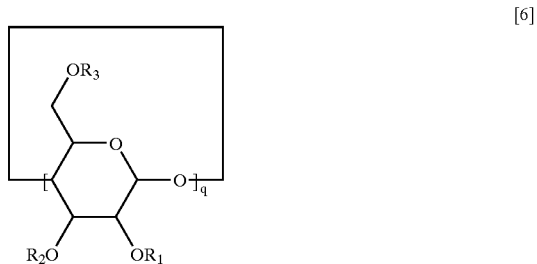

in which, q is an integer ranging from 6 to 12;

R$_1$, R$_2$ and R$_3$ are independently hydrogen atom, halogen atom, C$_{2\sim30}$ acyl group, C$_{1\sim20}$ alkyl group, C$_{3\sim10}$ alkene group, C$_2$ alkyne group, C$_{7\sim20}$ tosyl group, C$_{1\sim10}$ mesyl group, C$_{0\sim10}$ amino group or azido group, C$_{0\sim10}$ phosphorous group, C$_{3\sim20}$ imidazole group or pyridino group, C$_{3\sim10}$ cycloalkyl group, C$_{6\sim30}$ aryl group, C$_{1\sim20}$ hydroxy alkyl group, carboxyl group, C$_{1\sim20}$ carboxy alkyl group, glucosyl group or maltosyl group, C$_{1\sim10}$ cyano group, C$_{2\sim10}$ carbonate group, C$_{1\sim10}$ carbamate group, or silicon compounds represented by Sir$_1$r$_2$r$_3$, wherein r$_1$, r$_2$ and r$_3$ are independently C$_{1\sim5}$ alkyl group, C$_{1\sim5}$ alkoxy group, or C$_{6\sim20}$ aryl group.

5. The composition according to claim 4, wherein the cyclodextrin derivative is selected from the group consisting of α-, β- and γ-cyclodextrin derivatives represented by the following formulas (7) to (9):

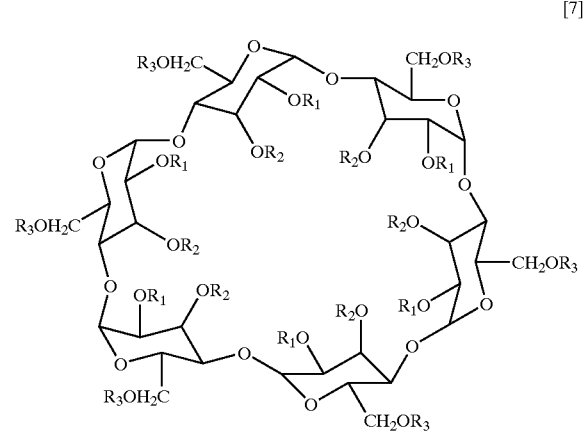

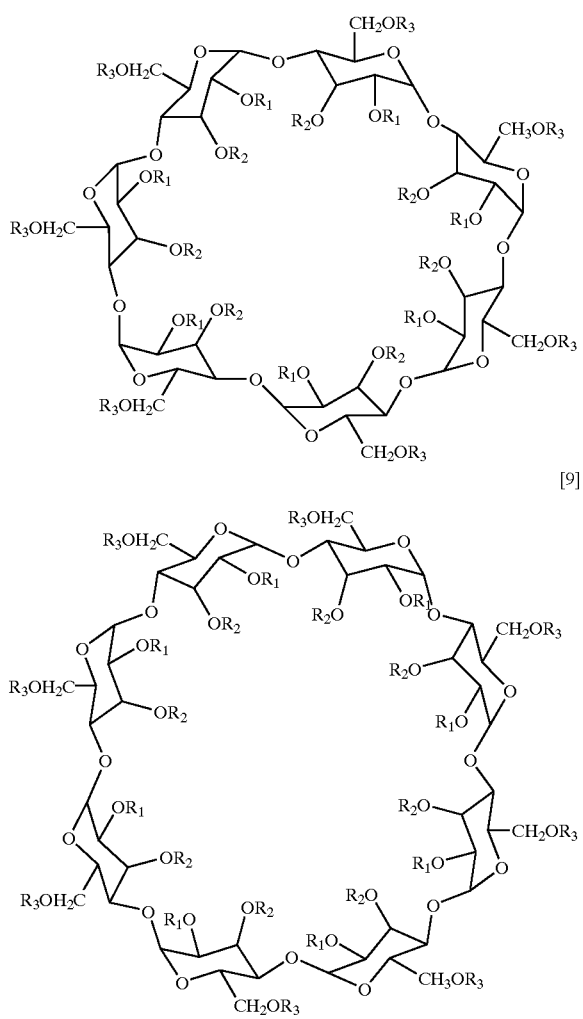

in which, $R_1$, $R_2$ and $R_3$ are independently hydrogen atom, $C_{2\sim30}$ acyl group, $C_{1\sim20}$ alkyl group, $C_{3\sim10}$ alkene group, $C_2$ alkyne group, $C_{7\sim20}$ tosyl group, $C_{1\sim10}$ mesyl group, $C_{3\sim10}$ amino group or azido group, $C_{0\sim10}$ phosphorous group, $C_{3\sim20}$ imidazole group or pyridino group, $C_{3\sim10}$ cycloalkyl group, $C_{6\sim30}$ aryl group, $C_{1\sim20}$ hydroxy alkyl group, carboxyl group, $C_{1\sim20}$ carboxy alkyl group, glucosyl group or maltosyl group, $C_{1\sim10}$ cyano group, $C_{2\sim10}$ carbonate group, $C_{1\sim10}$ carbamate group, or silicon compounds represented by $Sir_1r_2r_3$, wherein $r_1$, $r_2$ and $r_3$ are independently $C_{1\sim5}$ alkyl group, $C_{1\sim5}$ alkoxy group, or $C_{6\sim20}$ aryl group.

6. The composition according to claim 5, wherein the cyclodextrin derivative is selected from the group consisting of hexakis(2,3,6-tri-O-acetyl)-α-cyclodextrin, heptakis(2,3, 6-tri-O-acetyl)-cyclodextrin, octakis(2,3,6-tri-O-acetyl)-γ-cyclodextrin, hexakis(2,3,6-tri-O-methyl)-α-cyclodextrin, heptakis(2,3,6-tri-O-methyl)-β-cyclodextrin, hexakis(6-O-tosyl)-α-cyclodextrin, hexakis(6-amino-6-deoxy)-α-cyclodextrin, heptakis (6-amino-6-deoxy)-β-cyclodextrin, bis(6-azido-6-deoxy)-β-cyclodextrin, hexakis(2,3-O-acetyl-6-bromo-6-deoxy)-α-cyclodextrin, heptakis(2,3-O-acetyl-6-bromo-6-deoxy)-β-cyclodextrin, mono(2-O-phosphoryl)-α-cyclodextrin, mono(2-O-phosphoryl)-β-cyclodextrin, hexakis(6-deoxy-6-(1-imdazolyl))-β-cyclodextrin, and mono(2, (3)-O-carboxymethyl)-α-cyclodextrin.

7. The composition according to claim 1, wherein the matrix precursor is silsesquioxane, silica sol, organic silicate, or orthosilicate.

8. The composition according to claim 7, wherein the silsesquioxane is hydrogen silsesquioxane, alkyl silsesquioxane, aryl silsesquioxane, or copolymers thereof.

9. The composition according to claim 1, wherein the matrix precursor is polyimide, polybenzocyclobutene, polyarylene, polyarylene ether, polyphenylene, or mixtures thereof.

10. The composition according to claim 1, wherein the solvent is aromatic hydrocarbon-based solvent, ketone-based solvent, ether-based solvent, acetate-based solvent, amide-based solvent, γ-butyrolactone, acohol-based solvent, silicon-based solvent, or mixtures thereof.

11. The composition according to 10, wherein the solvent is anisole, mesitylene, xylene, methyl isobutyl ketone, 1-methyl-2-pyrrolidinone, acetone, tetrahydrofuran, isopropyl ether, ethyl acetate, butyl acetate, propylene glycol methyl ether acetate, dimethylacetamide, dimethylformamide, γ-butyolactone, isopropyl alcohol, butyl alcohol, octyl alcohol, silicon solvents, or mixtures thereof.

12. The composition according to claim 1, wherein the composition further comprises a coupling agent having two reactive groups, one of which can bind to a reactive group of the cyclodextrin derivative, and the other to a reactive group of the matrix precursor.

13. A method for forming interlayer insulating films between interconnect layers in microelectronic devices, said method comprising: coating the composition according to claim 1, on a substrate through spin-coating, dip-coating, spray-coating, flow-coating, or screen-printing;

evaporating the solvent therefrom; and heating the coating film at 150~600° C. under inert gas atmosphere or vacuum condition.

14. The method according to claim 13, wherein the coating is carried out by spin-coating at 1000~5000 rpm.

15. A substance having nano-pores, said substance being prepared by using the composition according to claim 1.

16. A method for using the substance having nano-pores according to claim 15, as heat-resistant materials, electric insulators, absorbents, or carriers for catalysts.

* * * * *